US012348930B2

(12) United States Patent
Dong et al.

(10) Patent No.: US 12,348,930 B2
(45) Date of Patent: Jul. 1, 2025

(54) ELECTRONIC APPARATUS

(71) Applicant: Samsung Electronics Co., Ltd., Suwon-si (KR)

(72) Inventors: Van Phuc Dong, Bac Ninh (VN); Van Quang Nguyen, Bac Ninh (VN); The Quan Nguyen, Bac Ninh (VN); Xuan Sinh Ngo, Bac Ninh (VN)

(73) Assignee: Samsung Electronics Co., Ltd., Suwon-si (KR)

(*) Notice: Subject to any disclaimer, the term of this patent is extended or adjusted under 35 U.S.C. 154(b) by 231 days.

(21) Appl. No.: 18/358,471

(22) Filed: Jul. 25, 2023

(65) Prior Publication Data
US 2023/0370769 A1 Nov. 16, 2023

Related U.S. Application Data

(63) Continuation of application No. PCT/KR2022/003775, filed on Mar. 17, 2022.

(30) Foreign Application Priority Data

Mar. 18, 2021 (KR) .......................... 10-2021-0035525

(51) Int. Cl.
*H04R 1/34* (2006.01)
*G06F 1/16* (2006.01)
(Continued)

(52) U.S. Cl.
CPC .......... *H04R 1/345* (2013.01); *G06F 1/1626* (2013.01); *H04M 1/03* (2013.01); *H04R 1/028* (2013.01);
(Continued)

(58) Field of Classification Search
CPC .... H04R 1/345; H04R 1/028; H04R 2499/11; G06F 1/1626; H04M 1/03; H05K 5/0217
(Continued)

(56) References Cited

U.S. PATENT DOCUMENTS 8,611,577 B2 12/2013 Jung et al.
8,824,719 B2 9/2014 Tanaka et al.
(Continued)

FOREIGN PATENT DOCUMENTS

CN 110519423 A 11/2019
CN 108848219 B 1/2021
(Continued)

OTHER PUBLICATIONS

International Search Report dated Jun. 28, 2022, issued in International Patent Application No. PCT/KR2022/003775.
(Continued)

*Primary Examiner* — Sean H Nguyen
(74) *Attorney, Agent, or Firm* — Jefferson IP Law, LLP

(57) ABSTRACT

An electronic apparatus is provided. The electronic apparatus includes a sound module, a housing configured to receive the sound module is accommodated and which includes a first hole formed at the back surface thereof and communicating with the sound module, and a second hole formed at one side surface thereof and communicating with the first hole, and a sealing member which is attached to the back surface of the housing, wherein the sealing member includes a recess formed at least one of side surfaces opposite to each other.

15 Claims, 14 Drawing Sheets

(51) Int. Cl.
*H04M 1/03* (2006.01)
*H04R 1/02* (2006.01)
*H05K 5/02* (2006.01)

(52) U.S. Cl.
CPC ........ *H05K 5/0217* (2013.01); *H04R 2499/11* (2013.01)

(58) Field of Classification Search
USPC .......................................................... 381/334
See application file for complete search history.

(56) References Cited

U.S. PATENT DOCUMENTS

| | | | |
|---|---|---|---|
| 9,661,410 | B1 | 5/2017 | Iwai et al. |
| 10,250,729 | B1 | 4/2019 | Jeon et al. |
| 10,827,054 | B2 | 11/2020 | Cha et al. |
| 2018/0192202 | A1* | 7/2018 | Wang ...................... H04R 7/16 |
| 2019/0037294 | A1* | 1/2019 | Hung ...................... H04R 1/025 |
| 2019/0349668 | A1 | 11/2019 | Mcclary et al. |
| 2020/0107446 | A1 | 4/2020 | Maki |
| 2021/0168231 | A1* | 6/2021 | Baker ...................... H05K 1/189 |
| 2021/0337055 | A1* | 10/2021 | Lee ........................ H04R 1/025 |

FOREIGN PATENT DOCUMENTS

| | | |
|---|---|---|
| EP | 1 181 800 B1 | 4/2006 |
| JP | 5434798 B2 | 3/2014 |
| JP | 2017-117895 A | 6/2017 |
| JP | 6166992 B2 | 7/2017 |
| KR | 10-1747968 B1 | 6/2017 |
| KR | 10-2018-0020653 A | 2/2018 |
| KR | 10-2019-0034063 A | 4/2019 |
| KR | 10-2019-0100917 A | 8/2019 |
| KR | 10-2020-0109903 A | 9/2020 |

OTHER PUBLICATIONS

Korean Office Action dated Feb. 24, 2025, issued in Korean Patent Application No. 10-2021-0035525.

* cited by examiner

ELECTRONIC APPARATUS

CROSS-REFERENCE TO RELATED APPLICATION(S)

This application is a continuation application, claiming priority under § 365(c), of an International application No. PCT/KR2022/003775, filed on Mar. 17, 2022, which is based on and claims the benefit of a Korean patent application number 10-2021-0035525, filed on Mar. 18, 2021, in the Korean Intellectual Property Office, the disclosure of which is incorporated by reference herein in its entirety.

BACKGROUND

1. Field

The disclosure relates to an electronic apparatus. More particularly, the disclosure relates to an electronic apparatus that includes a sound pathway that is formed within a housing and stably sealed by a sealing member.

2. Description of Related Art

Electronic apparatuses including a smartphone, a tablet, a wearable device, and the like may include at least one sound module disposed inside a housing. Sound modules (e.g., microphone, speaker, etc.) may be communicated with an outside through an opening formed at a side surface of the housing.

A sealing member may be gripped by a pick-up device (e.g., tweezers), and may be placed to cover an opening formed at a back surface of the housing. Accordingly, the sealing member may form a sound pathway between a sound module and an outside of the housing. However, the sealing member has problems in that it is difficult to accurately place the sealing member at a designated position of the housing, and the sealing member is easily lifted by a pick-up device in a process of being attached to the housing. Accordingly, there has been a problem of curling occurring at the sealing member so that sound within the sound pathway is leaked to the outside.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic apparatus which includes a sound pathway formed within a housing and stably sealed by a sealing member.

Additional aspects will be set forth in part in the description which follows and, in part, will be apparent from the description, or may be learned by practice of the presented embodiments.

In accordance with an aspect of the disclosure, an electronic apparatus is provided. The electronic apparatus includes a sound module, a housing configured to receive the sound module, and including a first hole that is formed at a back surface thereof and communicating with the sound module and a second hole that is formed at one side surface thereof and communicating with the first hole, and a sealing member attached to a back surface of the housing, wherein the sealing member includes a recess that is formed on at least one side surfaces that face each other.

The housing includes a seating surface on which a portion of the back surface is formed stepped in a front direction, the first hole may be formed at the seating surface, and the sealing member may be attached to the seating surface and cover the first hole.

The recess includes a first recess formed at a first side surface of the sealing member, and a second recess formed at a second side surface that faces the first side surface of the sealing member.

The sealing member includes an adhesive layer attached to the back surface of the housing to surround the first hole, and a base member disposed at a back surface of the adhesive layer, and the recess may be formed at the base member.

The base member includes a first base member that covers the back surface of the adhesive layer and is formed of an elastic material, and a second base member that covers a back surface of the first base member and is formed of a material rigid than the first base member, and the first and second recesses may be formed at the second base member.

The recess may be formed to be recessed from a back surface of the second base member toward a front direction thereof at a depth smaller than a thickness of the second base member.

The first base member may surround a protrusion area disposed in front of the recesses from among the second base member.

The first base member may have a predetermined thickness.

The second base member may be formed such that a front surface thereof has a flat surface shape, and a back surface thereof has a curved surface shape that be comes gradually closer with a front surface of the second base member toward the one side surface of the housing.

The sealing member may be disposed such that a side surface at which the recess is formed is perpendicular with the one side surface of the housing.

The housing includes a side wall surrounding the sealing member, and the side wall includes at least one additional recess at a position that faces the recess.

The recess includes a first recess formed at a first side surface of the sealing member, and a second recess formed at a second side surface that faces the first side surface of the sealing member, and the additional recess includes a third recess disposed at a position that faces the first recess, and a fourth recess disposed at a position that faces the second recess.

The housing includes a seating surface on which a portion of the back surface is formed stepped in a front direction, and the additional recess is extended and formed from the seating surface toward the back surface of the housing.

The first hole includes a first space in which one end communicates with the second hole, and a second space in which one end is overlapped with an opposite end of the first space, and the opposite end communicates with the sound module.

The second space includes a first area which overlaps with the first space and a second area which does not overlap with the second space, and the first and second recesses may be disposed at positions that correspond with the second area.

The housing includes an expansion area which extends toward an inner side of the first hole, and the sealing member includes a fifth recess that is inserted and formed at the front surface toward a back direction.

The sealing member includes an adhesive layer attached to the back surface of the housing to surround the first hole, a first base member that covers the back surface of the adhesive layer and is formed of an elastic material, and a second base member that covers the back surface of the first base member and is formed of a material rigid than the first base member, and the fifth recess may be extended and formed up to the second base member.

The second base member may be convexly formed toward the back direction from a position that corresponds to the fifth recess.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
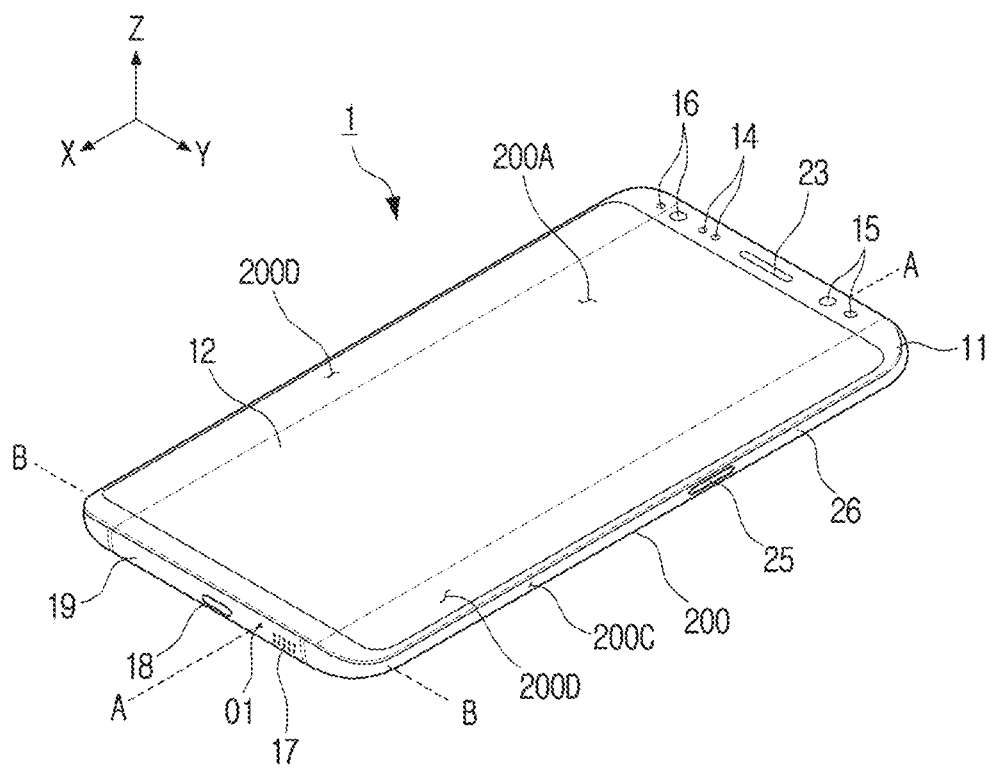
FIG. 1 is a front perspective view of an electronic apparatus according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

One or more embodiments described below are provided as examples to assist in understanding of the disclosure, and it is to be understood that the disclosure may be variously modified and realized, unlike to embodiments described herein. However, in describing the disclosure, in case it is determined that the detailed description of related known technologies may unnecessarily confuse the gist of the disclosure, the detailed description thereof and the detailed drawing thereof will be omitted. In addition, the accompanied drawing may be shown exaggerated in measurement of some elements rather than being shown according to its actual dimension to assist in the understanding of the disclosure.

Terms used in describing one or more embodiments of the disclosure are general terms selected considering their function herein. However, the terms may change depending on intention, legal or technical interpretation, emergence of new technologies, and the like of those skilled in the related art. Further, in certain cases, there may be terms arbitrarily selected. The terms described above may be interpreted according to the meaning defined in the disclosure, and no specific definition is described, the meaning of the term may be interpreted based on the overall context of the disclosure and technical sense common in the corresponding technical field.

In the disclosure, expressions such as "have," "may have," "include," "may include," or the like are used to designate a presence of a corresponding characteristics (e.g., elements such as numerical value, function, operation, or component), and not to preclude a presence or a possibility of additional characteristics.

Further, in the disclosure, because elements necessary in describing each embodiment of the disclosure are described, the embodiments are not necessarily limited thereto. Accordingly, some elements may be modified or omitted, and other elements may be added. In addition, the elements may be distributed to devices independent from one another and disposed.

Furthermore, although one or more embodiments of the disclosure have been described in detail below with reference to the accompanied drawings and the descriptions of the accompanied drawings, the disclosure is not limited to the embodiments.

An electronic apparatus in accordance with various embodiments of the disclosure may include at least one from among, for example, and without limitation, a smartphone, a tablet personal computer (tablet PC), a mobile phone, a video telephone, an electronic book reader (e-book reader), a desktop PC, a laptop PC, a netbook computer, a workstation, a server, a personal digital assistant (PDA), a portable multimedia player (PMP), a moving picture experts group phase 1 or phase 2 (MPEG-1 or MPEG-2) audio layer-3 (MP3) player, a mobile medical device, a camera, or a wearable device. According to the various embodiments, the wearable device may include at least one from among an accessory type (e.g., a watch, a ring, a bracelet, an anklet, a necklace, a pair of glasses, a contact lens or a head-mounted-device (HMD)), a fabric or a garment-embedded type (e.g., an electronic clothing), a body-attached type (e.g., a skin pad or a tattoo), or a bio-implantable type (e.g., an implantable circuit).

In some embodiments, the electronic apparatus may be a home appliance. The home appliance may include at least one from among, for example, and without limitation, a television, a digital video disk (DVD) player, an audio, a refrigerator, an air conditioner, a cleaner, an oven, a microwave, a washer, an air purifier, a set-top box, a home automation control panel, a security control panel, a television (TV) box (e.g., Samsung HomeSync™, Apple TV™, or Google TV™), a game console (e.g., Xbox™, PlayStation™), an electronic dictionary, an electronic key, a camcorder, an electronic frame, or the like.

In other embodiments, the electronic apparatus may include at least one from among various medical devices (e.g., various portable medical measurement devices (glucose measuring device, a heart rate measuring device, a blood pressure measuring device, a temperature measuring device, etc.), a magnetic resonance angiography (MRA), a magnetic resonance imaging (MRI), a computed tomography (CT), an imaging apparatus, an ultrasonic device, etc.), a navigation device, a global navigation satellite system (GNSS), an event data recorder (EDR), a flight data recorder (FDR), a vehicle infotainment device, a nautical electronic equipment (e.g., nautical navigation device, gyro compass, etc.), an avionics electronic device, a security device, a vehicle head unit, an industrial or household robot, an automated teller machine (ATM) of financial institutions, a point of sales (POS) of shops, or an internet of things device (e.g., a light bulb, various sensors, an electric or gas meter, a sprinkler device, a fire alarm, a thermostat, a street light, a toaster, an exercise equipment, a hot water tank, a heater, a boiler, etc.).

According to one or more embodiments, the electronic apparatus may include at least one from among a part of a furniture or a building/structure, an electronic board, an electronic signature receiving device, a projector, or various measurement devices (e.g., waterworks, electricity, gas, propagation measurement device, etc.). In the various embodiments, the electronic apparatus may be one from among the various devices described above or a combination of at least one thereof. The electronic apparatus according to one or more embodiments may be a flexible electronic apparatus. In addition, the electronic apparatus according to one or more embodiments of the disclosure is not limited to the above-described devices, and may include a new electronic apparatus based on developments in technology.

The disclosure will be described in greater detail below with reference to the accompanied drawings.

Figure 2:
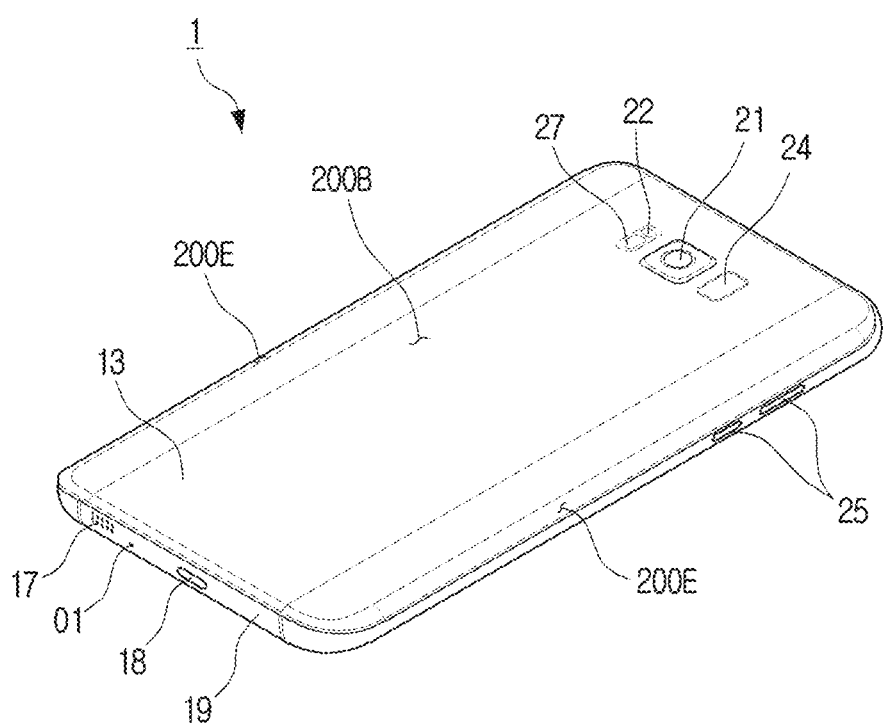
FIG. 2 is a back perspective view of an electronic apparatus according to an embodiment of the disclosure.

FIG. 1 is a front perspective view of an electronic apparatus according to an embodiment of the disclosure. FIG. 2 is a back perspective view of an electronic apparatus according to an embodiment of the disclosure.

Referring to FIGS. 1 and 2, an electronic apparatus 1 according to one or more embodiments of the disclosure may include a housing 200 which includes a front surface 200A, a back surface 200B, and a side surface 200C surrounding a space between the front surface 200A and the back surface 200B.

The front surface 200A of the housing 200 may be formed by a front cover 11 (e.g., a glass plate or a polymer plate that includes various coating layers) of which at least a portion thereof is substantially transparent.

The front cover 11 may cover a front surface of a display 12, and have a size corresponding to the display 12. The front cover 11 may prevent damage to the display that is generated by an external impact due to a repeated touch by a user or an un intended fall. The front cover 11 may be glass, hard plastic, and the like.

The back surface 200B of the housing 200 may be formed by a substantially opaque back cover 13. The back cover 13 may be formed by, for example, a coated or colored glass, ceramic, polymer, metal (e.g., aluminum, stainless steel (STS), or magnesium), or a combination of at least two from among the materials described above.

The back cover 13 may form a back surface of the electronic apparatus 1. The back cover 13 may cover such that a plurality of electronic components that are disposed within the electronic apparatus 1 are not exposed to the outside. Accordingly, the electronic apparatus 1 may have a clean exterior.

The side surface 200C of the housing 200 may be coupled with the front cover 11 and the back cover 13, and may be formed by a side bezel structure 26 that includes a metal and/or polymer. According to one or more embodiments, the back cover 13 and the side bezel structure 26 may be integrally formed and include a same material (e.g., metal material such as aluminum).

The front cover 11 may include two first edge areas 200D which are bent from the front surface 200A of the housing 200 toward the back cover 13 side and seamlessly extended at both ends of a long edge.

The back cover 13 may also include two second edge areas 200E which are bent from the back surface 200B of the housing 200 toward the front cover 11 side and seamlessly extended at both ends of the long edge like the front cover 11.

The front cover 11 (or back cover 13) may include only one from among the first edge areas 200D (or second edge areas 200E). In other embodiments, a portion from among the first edge areas 200D or the second edge areas 200E may not be included.

When viewed from a side surface of the electronic apparatus 1, the side bezel structure 26 may have a first thickness (or width) in the side of the side surface at which the first edge areas 200D or the second edge areas 200E are not included, and have a second thickness thinner than the first thickness in the side of the side surface that includes the first edge areas 200D or the second edge areas 200E.

The electronic apparatus 1 may include at least one from among the display 12, an audio module 01, 17, and 23, sensor modules 14, 24, and 27, a camera module 15, 21, and 22, a key input device 25, a light emitting device 16, and connector holes 18 and 19.

In addition, the electronic apparatus 1 may omit at least one (e.g., the key input device 25 or the light emitting device 16) from among the elements, or additionally include another element.

The display 12 may display various content (e.g., text, image, video, icon, symbol, etc.) to the user. For example, the display 12 may be at least one from among a liquid crystal display (LCD), a light-emitting diode (LED) display, an organic light-emitting diode (OLED) display, a microelectromechanical systems (MEMS) display, and an electronic paper display.

The display 12 may be exposed through a substantial portion of the front cover 11. According to one or more embodiments, at least a portion of the display 12 may be exposed through the front cover 11 which forms the front surface 200A of the housing 200, and the first edge areas 200D of the side surface 200C.

Corners of the display 12 may be formed substantially the same as an adjacent outer shape of the front cover 11.

In other embodiments (not shown), to expand the area at which the display 2 is exposed, a distance between an outer part of the display 12 and an outer part of the front cover 11 may be formed substantially the same.

A screen display area of the display 12 may be formed with a recess or an opening at a portion thereof, and the electronic apparatus 1 may include at least one from among a sensor module 14, a first camera device 15, the light emitting device 16, and the audio module 01, 17, and 23 which are arranged with the recess or the opening described above.

At a rear surface of the screen display area of the display 12, at least one from among the sensor module 14, the first camera device 15, the light emitting device 16, the audio module 01, 17, and 23, and a fourth sensor module 24 may be included. In other embodiments (not shown), the display 12 may be coupled or adjacently disposed with a touch sensing circuit, a pressure sensor capable of measuring an intensity (pressure) of a touch, and/or a digitizer that senses a stylus pen of a magnetic method. According to one or more embodiments, at least a portion of the sensor module 14 and/or at least a portion of the key input device 25 may be disposed at the first edge areas 200D and/or the second edge areas 200E.

The audio module 01, 17, and 23 may include a first opening 01 and speaker holes 17 and 23. A microphone for obtaining an outside sound may be disposed inside the first opening 01, and in one or more embodiments, a plurality of microphones may be disposed so as to sense a direction of sound. The speaker holes 17 and 23 may include an external speaker hole 17 and a communication receiver hole 23. According to one or more embodiments, the speaker holes 17 and 23 and the first opening 01 may be implemented as one hole, or a speaker may be included without the speaker holes 17 and 23 (e.g., piezo speaker).

The sensor modules 14, 24, and 27 may generate an electric signal or a data value corresponding to an inside operating state or an outside environment state of the electronic apparatus 1. The sensor modules 14, 24, and 27 may include, for example, a first sensor module 14 (e.g., a proximity sensor) and/or a second sensor module (not shown; e.g., a finger print sensor) disposed at the front surface 200A of the housing 200, and/or a third sensor module 27 (e.g., a heart rate monitor (HRM) sensor) and/or the fourth sensor module 24 (e.g., a finger print sensor) disposed at the back surface 200B of the housing 200. The finger print sensor may be disposed at not only the front surface 200A of the housing 200, but also at the back surface 200B thereof. The electronic apparatus 1 may further include at least one from among the sensor modules that are not shown, such as, for example, a gesture sensor, a gyro sensor, a barometer sensor, a magnetic sensor, an acceleration sensor, a grip sensor, a color sensor, an infrared (IR) sensor, a biometric sensor, a temperature sensor, a humidity sensory, or an illuminance sensor.

The camera modules 15, 21, and 22 may include a first camera device 15 disposed at the front surface 200A of the housing 200, and a second camera device 21 and/or a flash 22 disposed at the back surface 200B thereof.

The first and second camera devices 15 and 21 may include one or a plurality of lenses, an image sensor, and/or an image signal processor. The flash 22 may include, for example, a light-emitting diode or a xenon lamp. According to one or more embodiments, at least two lenses (an infrared camera, a wide-angle and telephoto lens) and image sensors may be disposed at one surface of the electronic apparatus 1.

The key input device 25 may be disposed at the side surface 200C of the housing 200. In other embodiments, the electronic apparatus 1 may not include a portion or all of the key input device 25, and the key input device 25 that is not included may be implemented in another form such as a soft key on the display 12.

The key input device 25 may include the fourth sensor module 24 disposed at the back surface 200B of the housing 200.

The light emitting device 16 may be disposed, for example, at the front surface 200A of the housing 200. The light emitting device 16 may provide, for example, status information of the electronic apparatus 1 in light form. In other embodiments, the light emitting device 16 may provide, for example, a light source that is cooperated with an operation of the first camera device 15. The light emitting device 16 may include, for example, an LED, an IR LED, and a xenon lamp.

The connector holes 18 and 19 may include a first connector hole 18 which can receive a connector (e.g., a universal serial bus (USB) connector) for transmitting and receiving power and/or data with an external electronic apparatus, and/or a second connector hole 19 (e.g., an earphone jack) which can receive a connector for transmitting and receiving an audio signal with the external electronic apparatus.

Figure 3:
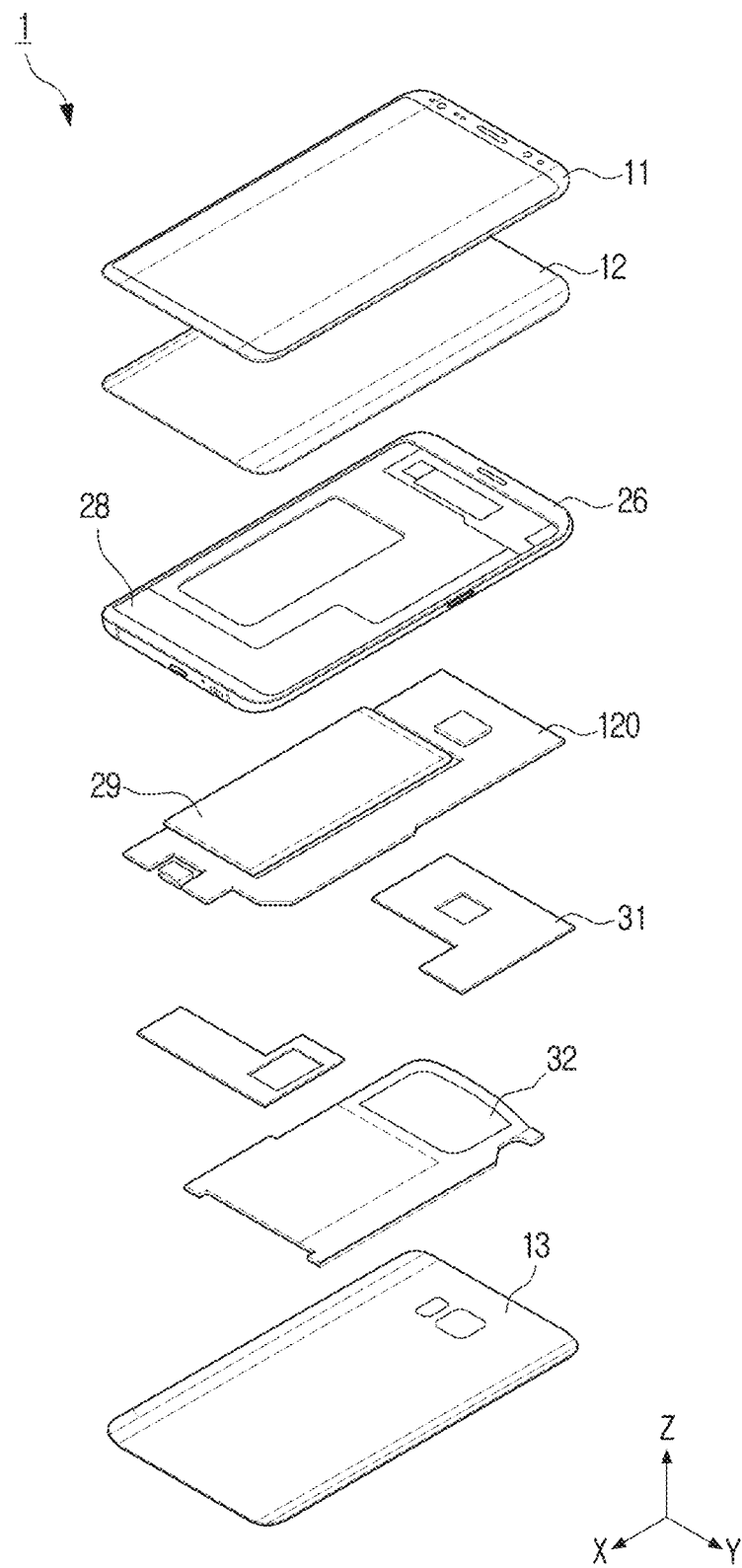
FIG. 3 is an exploded perspective view of an electronic apparatus according to an embodiment of the disclosure.

FIG. 3 is an exploded perspective view of an electronic apparatus according to an embodiment of the disclosure.

Referring to FIG. 3, the electronic apparatus 1 may include the side bezel structure 26, a bracket 28, the front cover 11, the display 12, a printed circuit board 120, a battery 29, a rear case 31, an antenna 32, and the back cover 13. In one or more embodiments, the electronic apparatus 1 may omit at least one (e.g., bracket 28 or rear case 31) from among the elements or additionally include another element.

At least one from among the elements of the electronic apparatus 1 may be the same or similar with at least one from among the elements of the electronic apparatus 1 in FIG. 1 or 2, and redundant descriptions thereof will be omitted.

The bracket 28 may be disposed inside the electronic apparatus 1 and may be connected with the side bezel structure 26, or formed integrally with the side bezel structure 26. The bracket 28 may be formed of, for example, a metal material and/or a non-metal (e.g., polymer) material. The bracket 28 may be configured such that the display 12 is coupled to one surface thereof, and the printed circuit board 120 is coupled to an opposite surface thereof. In the printed circuit board 120, a processor, a memory, and/or an interface may be mounted thereto.

The processor may include at least one from among, for example, a central processing unit, an application processor, a graphic processing unit, an image signal processor, a sensor hub processor, or a communication processor. The memory may include, for example, a volatile memory or a non-volatile memory. The interface may include, for example, a high definition multimedia interface (HDMI), a universal serial bus (USB) interface, a secure digital (SD) card interface, and/or an audio interface. The interface may, for example, electrically or physically connect the electronic apparatus 1 with an external electronic apparatus, and include a USB connector, an SD card/mobile module connector (MMC) connector, or an audio connector.

The battery 29 may be a device for supplying power to at least one element of the electronic apparatus 1, and may include, for example, a non-rechargeable primary cell, or a rechargeable secondary cell, or a fuel cell.

At least a portion of the battery 29 may be disposed, for example, on a substantially the same plane as with the printed circuit board 120. The battery 29 may be disposed integrally inside the electronic apparatus 1, and may be disposed to be attachable to or detachable from the electronic apparatus 1.

The antenna 32 may be disposed between the back cover 13 and the battery 29. The antenna 32 may include, for example, a near field communication (NFC) antenna, a wireless charging antenna, and/or a magnetic secure transmission (MST) antenna.

The antenna 32 may, for example, perform short range communication with an external device, or transmit and receive power necessary for charging wirelessly. In other embodiments, an antenna structure may be formed by a portion of the side bezel structure 26 and/or the bracket 28 or by a combination thereof.

Figure 4:
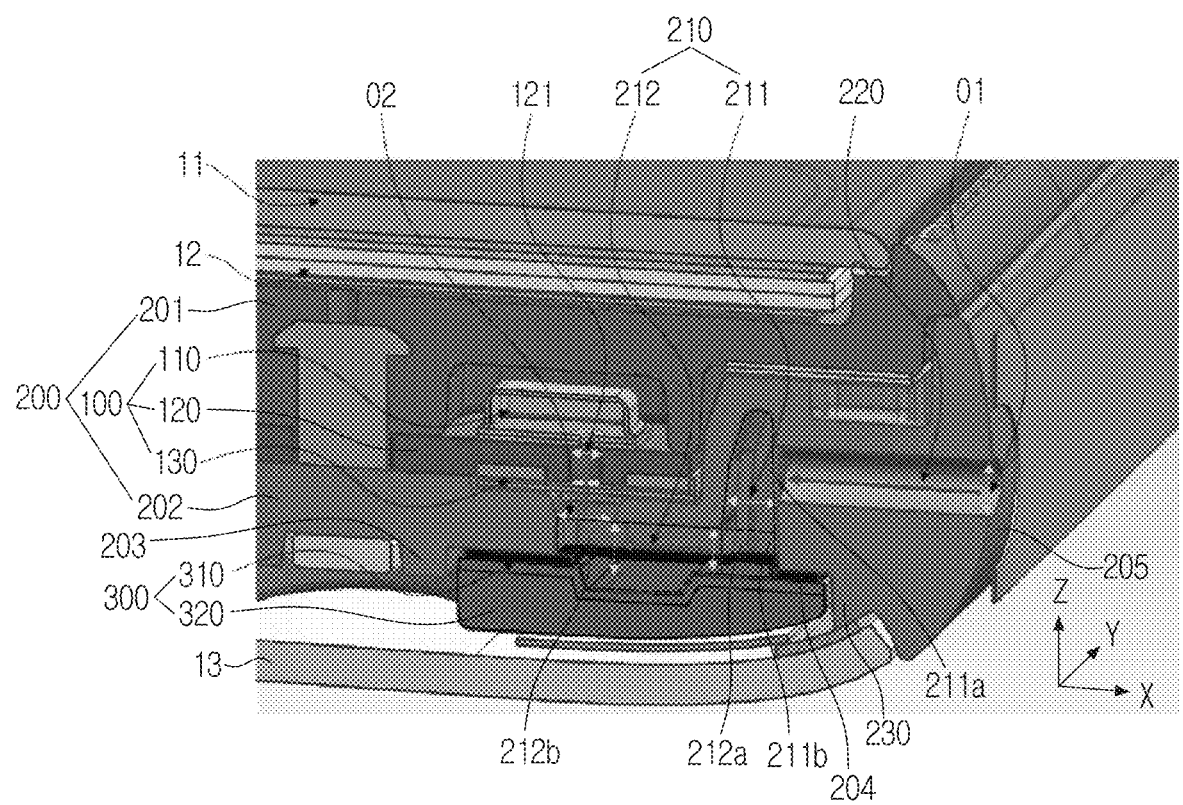
FIG. 4 is a cross-sectional view of the electronic apparatus of FIG. 1 taken along line A-A according to an embodiment of the disclosure.
Figure 5:
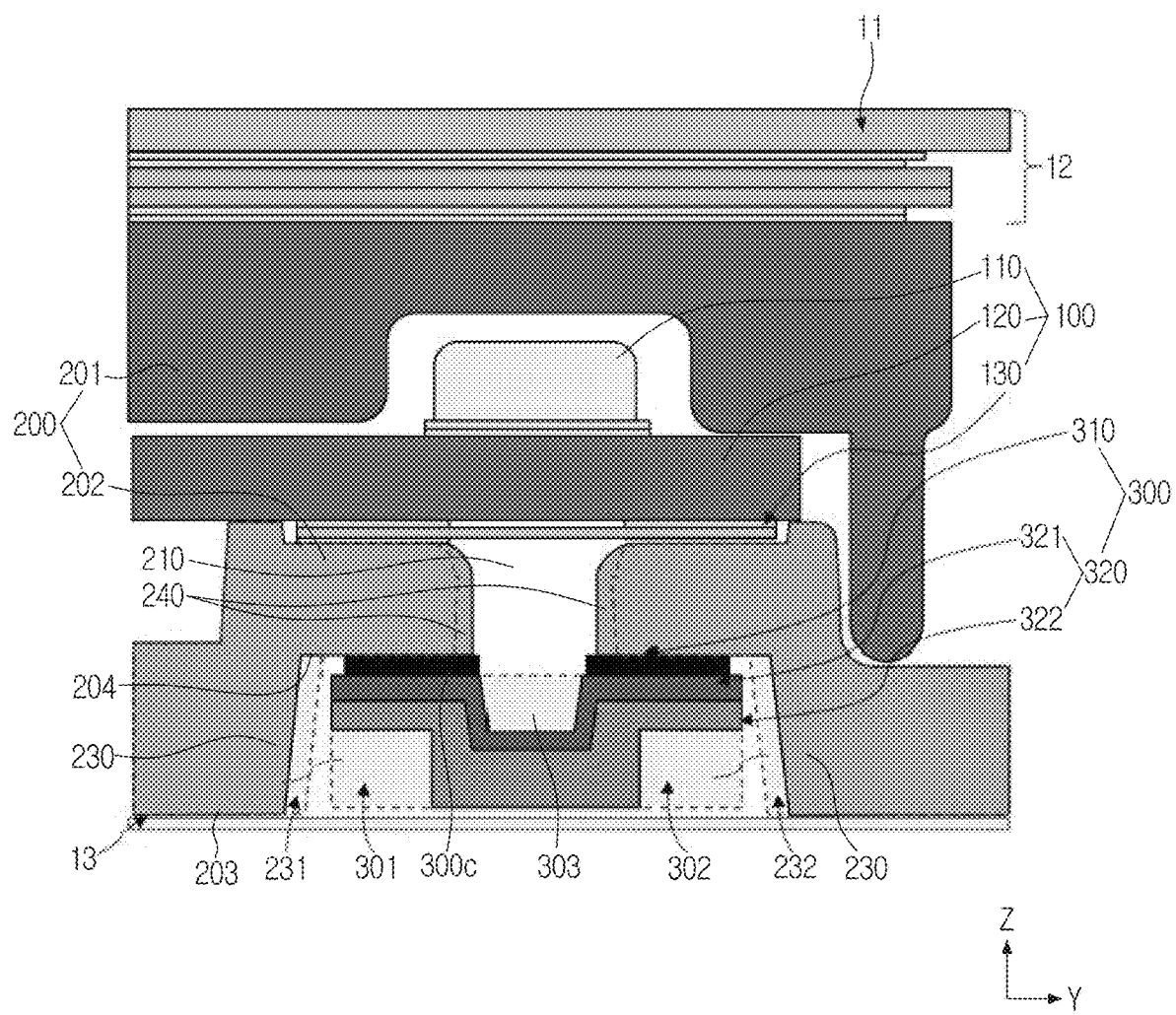
FIG. 5 is a cross-sectional view of the electronic apparatus of FIG. 1 taken along line B-B according to an embodiment of the disclosure.

FIG. 4 is a cross-sectional view of the electronic apparatus of FIG. 1 taken along line A-A according to an embodiment of the disclosure. FIG. 5 is a cross-sectional view of the electronic apparatus of FIG. 1 taken along line B-B according to an embodiment of the disclosure.

Referring to FIGS. 4 and 5, the electronic apparatus 1 according to one or more embodiments may further include a sound module 100 and a sealing member 300.

The sound module 100 may include a microphone case 110, the printed circuit board 120, and a microphone mesh 130.

The microphone case 110 may be disposed at a front surface of the printed circuit board 120. Specifically, the microphone case 110 may be disposed within a receiving space of a front housing 201 and be protected from external impact.

The microphone case 110 may form an inside space of roughly a rectangular parallelepiped shape. The microphone case 110 may be receive a MEMS microphone chip (not shown) and an ASIC chip (not shown) which are mounted to the front surface of the printed circuit board 120 inside thereof.

The printed circuit board 120 may be fixed and supported by the front housing 201. The printed circuit board 120 may include a substrate hole 121 which penetrates through from the back surface toward the front surface in a thickness direction (+Z direction) and is communicated with an inside space of the microphone case 110. Accordingly, the sound may travel from a back surface of the printed circuit board 120 toward the front surface thereof, and travel inside the microphone case 110.

The printed circuit board 120 may be mounted with only the microphone case 110, the microphone mesh 130, and a plurality of chips of the sound module 100, but is not limited thereto, and may be referring to a portion area from among the substrate on which electronic devices such as, for example, and without limitation, an audio, a camera, a sensor, a display, and the like of the electronic apparatus 1 are mounted.

The microphone mesh 130 may be disposed at the back surface of the printed circuit board 120. The microphone mesh 130 may be attached to a back housing 202, and disposed so as to be overlapped with the substrate hole 121.

The microphone mesh 130 may have a net structure that is formed with metal. The microphone mesh 130 may include a super hydrophobic and super-hydrorepellent film that blocks moisture, and prevent an external foreign material, moisture, or the like from penetrating inside the microphone case 110. For example, the microphone mesh 130 may be formed of fabrics such as, for example, and without limitation, Gore-Tex, felt, and the like.

The sound module 100 may be shown as having a microphone structure, but the type is not limited thereto, and may have a speaker structure.

The housing 200 may form the side surface of the electronic apparatus 1. The housing 200 may be disposed between the front cover 11 and the back cover 13, and support a plurality of electronic components inside thereof.

The housing 200 may include the front housing 201 and the back housing 202. The front housing 201 may be disposed at the rear of the display 12, and support the back surface of the display 12. The back housing 202 may be disposed between the front housing 201 and the back cover 13. However, the housing 200 is not always implemented divided into two housings of front and back housings 201 and 202, and may be implemented as a single housing.

The housing 200 may receive the sound module 100. Specifically, the sound module 100 may be disposed in a space formed inside the housing 200 and be protected from external impact.

The housing 200 may include a first hole 210 which is formed at a back surface 203 thereof and communicates with the sound module 100. In addition, the housing 200 may include a second hole 220 which is formed at one side surface 205 thereof and communicates with the first hole 210.

The housing 200 may include a seating surface 204 at which a portion of the back surface 203 is formed to be stepped in a front direction (+Z direction). That is, the seating surface 204 may be disposed in front of the back surface 203. The seating surface 204 may be disposed in parallel with the back surface 203.

The first hole 210 may be formed at the seating surface 204. The first hole 210 may be sealed by the sealing member 300 which will be described below and blocked from the outside. That is, the sealing member 300 may be attached to the seating surface 204 and cover the first hole 210.

The second hole 220 may include the first opening 01 formed on the one side surface 205 of the housing 200. That is, the sound generated from the outside of the electronic apparatus 1 may pass through the first opening 01 and enter inside the electronic apparatus 1. In addition, the first hole 210 may include a second opening 02 which is disposed to communicate with the substrate hole 121. Accordingly, the sound that passed through the first hole 210 may travel inside the microphone case 110 through the second opening 02.

That is, the sound generated from outside the electronic apparatus 1 may enter inside the electronic apparatus 1 passing through the first opening 01 disposed at one end of the second hole 220, and reach the sound module 100 by passing through the second hole 220 and the first hole 210 sequentially.

The first hole 210 may be formed such that a portion of the seating surface 204 is recessed toward the front direction. The first hole 210 may include a first space 211 and a second space 212.

Specifically, the first space 211 may be formed such that one end 211a thereof communicates with the second hole 220. In addition, the second space 212 may formed such that one end 212a be overlapped with an opposite end 211b of the first space 211, and an opposite end 212b may communicate with the sound module 100.

The first space 211 may be disposed at a front end of a sound introduction path and formed elongated along a Z-axis direction, and the second space 212 may be disposed at a back end of the sound introduction path and formed elongated along an X-axis direction.

The sealing member 300 may be attached to the seating surface 204 and cover the first hole 210.

In addition, the sealing member 300 may include a recess which is formed on at least one from among both side surfaces that face each other.

A first recess 301 and a second recess 302 which are formed respectively at both side surfaces that face each other so as to be spaced apart from the housing 200 may be included. Specifically, the recess may include the first recess 301 which is formed at a first side surface 300a of the sealing member 300 and the second recess 302 which is formed at a second side surface 300b that faces the first side surface 300a of the sealing member 300.

The first and second recesses 301 and 302 may be formed by being recessed from a back surface of the sealing member 300 toward the front by a predetermined depth. The first and second recesses 301 and 302 may form two concave surfaces at both side surfaces of the sealing member 300.

Although the recesses formed at the sealing member 300 have been shown as two, a number of recesses are not limited thereto, and the recesses of the sealing member 300 may be formed as one at one side surface of the sealing member 300.

When the sealing member 300 is attached to the seating surface 204, the pick-up device (e.g., tweezers, etc.) may grip the concave surfaces of the sealing member 300 formed by the first and second recesses 301 and 302 and position the sealing member 300 on the seating surface 204. Then, the pick-up device or a separate pressing device may press the sealing member 300 to the front direction and attach it to the seating surface 204. At this time, the first and second recesses 301 and 302 may accurately guide a grip position of the pick-up device.

In addition, a space of a sufficient size may be formed between the side surface of the sealing member 300 and the housing 200 by the first and second recesses 301 and 302. Accordingly, because the pick-up device opens sufficiently toward the space between the first and second recesses 301 and 302 and the housing 200 after placing the sealing member 300 on the seating surface 204, the pick-up device does not interfere with the sealing member 300. Thus, the sealing member 300 may be stably attached at a designated position of the seating surface 204 without being unintentionally lifted by the pick-up device in the attaching process.

The sealing member 300 may include an adhesive layer 310 and a base member 320. The adhesive layer 310 may be attached to the back surface 203 of the housing 200 to surround the first hole 210. Specifically, the adhesive layer 310 may be attached to the seating surface 204 of the housing 200. The base member 320 may be disposed at the back surface 203 of the adhesive layer 310.

The adhesive layer 310 may have a closed loop shape that surrounds an opening formed at the seating surface 204 by the first hole 210. The adhesive layer 310 may fix the sealing member 300 to the housing 200. Because the front surface of the adhesive layer 310 is attached to the seating surface 204, the sealing member 300 may cover the first hole 210, and sound inside of the first hole 210 may not be leaked to the back direction of the housing 200.

The first and second recesses 301 and 302 may be formed at the base member 320. That is, the first and second recesses 301 and 302 may be formed to be recessed from the back surface of the sealing member 300 toward the front direction thereof by a predetermined depth, but may not be formed up to the adhesive layer 310. Accordingly, the adhesive layer 310 may be attached to the seating surface 204 at a wide area.

Specifically, the base member 320 may include a first base member 321 and a second base member 322.

The first base member 321 may cover a back surface of the adhesive layer 310 and be formed of an elastic material. The second base member 322 may cover a back surface of the first base member 321, and be formed of a material more rigid than the first base member 321.

That is, the sealing member 300 may have a structure in which the adhesive layer 310, the first base member 321, and the second base member 322 are sequentially stacked.

The first base member 321 may be formed of rubber, and the second base member 322 may be formed of plastic, but the materials are not limited thereto. In addition, the first and second base members 321 and 322 may be formed of the same material with one another.

When the sealing member 300 is attached on the seating surface 204, because the first base member 321 formed of an elastic material transfers pressure equally and gradually in the front direction thereof toward the adhesive layer 310 and the housing 200, the sealing member 300 and the housing 200 are not damaged, and the front surface of the adhesive layer 310 may be attached more stably and equally on the seating surface 204.

Because the second base member 322 may increase rigidity of the whole sealing member 300, the sealing member 300 may not be damaged by an attachment pressure.

The first and second recesses 301 and 302 may be formed at the second base member 322. That is, the first and second recesses 301 and 302 may not be formed at the first base member 321 and the adhesive layer 310. Accordingly, when a back surface of the second base member 322 is pressed, because pressure is equally transferred throughout the whole back surface of the adhesive layer 310 through the first and second base members 321 and 322, the sealing member 300 may be attached strongly with high adhesion on the seating surface 204.

The housing 200 may include a side wall 230 that surrounds the sealing member 300. The side wall 230 may be disposed to surround the side surface of the sealing member 300. The side wall 230 may include at least one additional recess at a position that faces the recess of the sealing member 300.

Specifically, the additional recesses of the side wall 230 may include a third recess 231 and a fourth recess 232 at positions which respectively face the first and second recesses 301 and 302.

However, a number of additional recesses of the side wall 230 is not limited to two, and may be formed same as the number of recesses of the sealing member 300.

The third and fourth recesses 231 and 232 may be formed such that the side wall 230 becomes farther from the sealing member 300. Based on the third and fourth recesses 231 and 232 being formed, a space between the sealing member 300 and the side wall 230 may become larger.

Accordingly, because the pick-up device opens sufficiently toward the space between the first and second recesses 301 and 302 and the housing 200 after placing the sealing member 300 on the seating surface 204, the pick-up device does not interfere with the sealing member 300. Thus, the sealing member 300 may be stably attached at the designated position of the seating surface 204 without being unintentionally lifted by the pick-up device in the attaching process.

When the side wall 230 includes the third and fourth recesses 231 and 232, a size of the space between the side wall 230 and the sealing member 300 may be the same even if a width of the first and second recesses 301 and 302 formed at the sealing member 300 in a Y-axis direction is decreased.

That is, because the sufficient space in which the pick-up device is to be parted is still secured while the width of the first and second recesses 301 and 302 is simultaneously decreased, a size of the back surface of the sealing member 300 may increase. Accordingly, because the pressing device or the pick-up device can apply significant pressure to the back surface which has a wider area of the sealing member 300, the sealing member 300 may be strongly attached on the seating surface 204.

The third and fourth recesses 231 and 232 may be extended and formed from the seating surface 204 toward the back surface 203 of the housing 200. That is, the third and fourth recesses 231 and 232 may be formed at a height same as the side wall 230. Accordingly, because the seating surface 204 is formed without a step, the sealing member 300 may not be separated or lifted from the designated position by being interfered by the step, and may be easily disposed at the designated position on the seating surface 204.

In addition, the third and fourth recesses 231 and 232 may guide a position at which the sealing member 300 is to be placed. Specifically, based on the first and second recesses 301 and 302 of the sealing member 300 being disposed to respectively face the third and fourth recesses 231 and 232, the sealing member 300 may be accurately placed at a pre-set position on the seating surface 204.

The housing 200 may include an expansion area 240 which extends toward an inner side of the first hole 210 such that an area of the seating surface 204 becomes greater. Because the sealing member 300 and the seating surface 204 can be contacted at a wider area by the expansion area 240, the sealing member 300 may be more strongly attached to the seating surface 204.

In addition, the sealing member 300 may include a fifth recess 303 which is recessed at a front surface 300c thereof toward the back direction (−Z direction). The fifth recess 303 may be disposed between the first and second recesses 301 and 302.

An inner space of the sealing member 300 formed by the fifth recess 303 may communicate with the first hole 210. Because the inside space of the housing 200 through which sound travels is narrowed by the expansion area 240 in a width direction (direction parallel with a Y-axis) of the first hole 210 and expanded in the back direction along the −Z direction by the fifth recess 303, the overall volume thereof may be maintained the same.

That is, the sealing member 300 may be strongly attached to the seating surface 204 with the wider area by the expansion area 240, and at the same time, a sound characteristic determined by a volume of the sound pathway may be maintained the same by the fifth recess 303.

Figure 6:
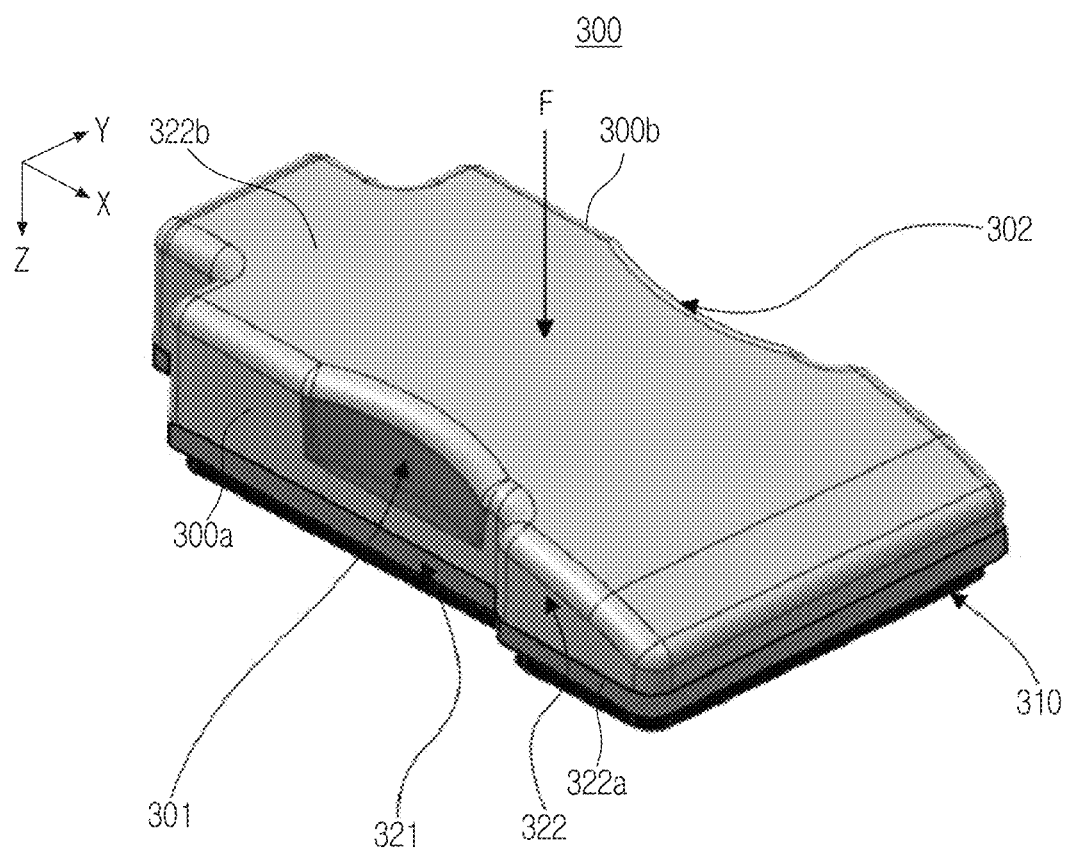
FIG. 6 is a perspective view of a sealing member according to an embodiment of the disclosure.
Figure 7:
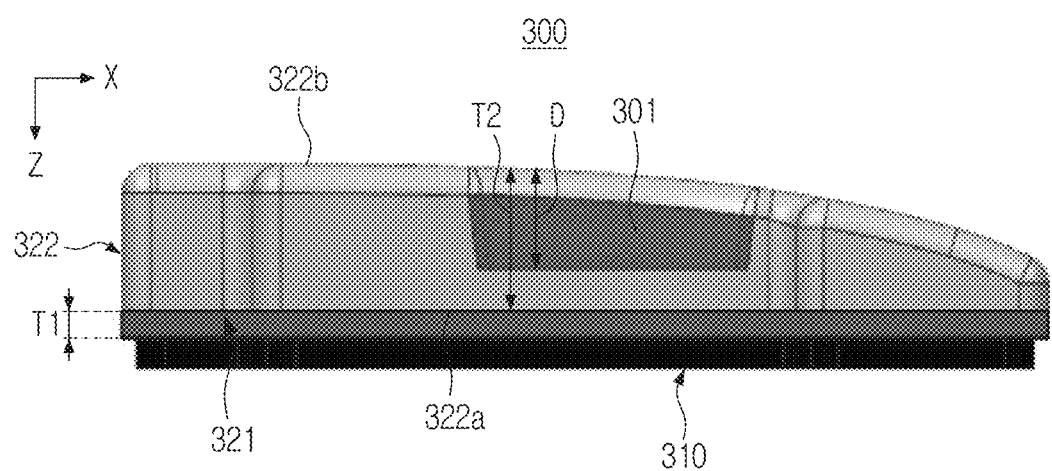
FIGS. 7 and 8 are respectively a side view and a bottom view of the sealing member of FIG. 6 according to various embodiments of the disclosure.
Figure 8:
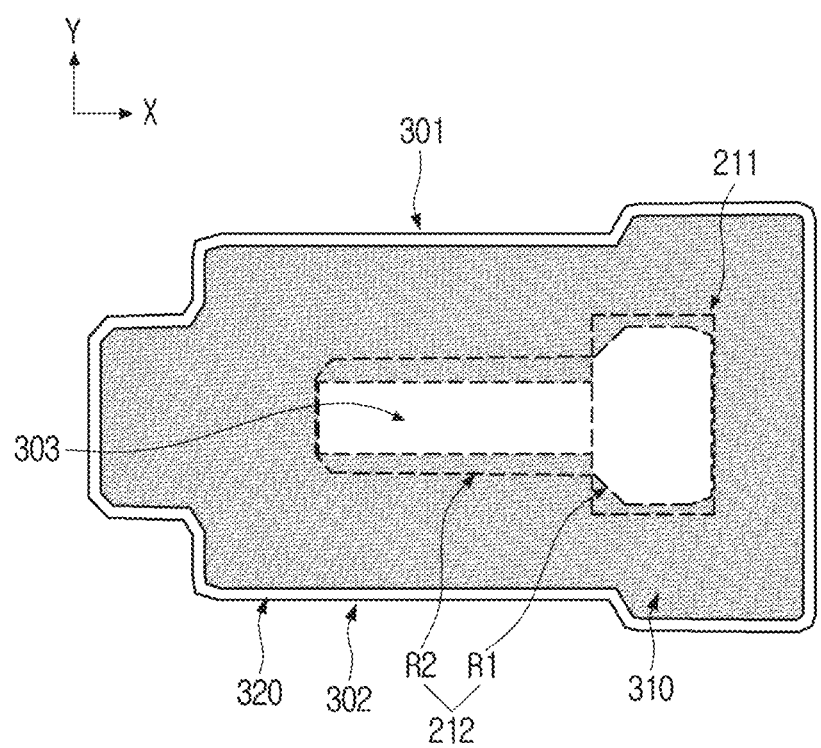

FIG. 6 is a perspective view of a sealing member according to an embodiment of the disclosure. FIGS. 7 and 8 are respectively a side view and a bottom view of the sealing member of FIG. 6 according to various embodiments of the disclosure. The sealing member 300 may have a structure in which the adhesive layer 310, the first base member 321, and the second base member 322 are sequentially stacked.

When attaching the sealing member 300 to the housing 200, if pressure is applied to a back surface of the base member 320, the pressure may be transferred to the adhesive layer 310 through the base member 320, and accordingly, the adhesive layer 310 may be attached to the seating surface 204.

In the base member 320 of the sealing member 300 having a structure in which the first and second base members 321 and 322 formed of different materials are stacked, when pressure is applied to a back surface 322b of the second base member 322, the pressure may be transferred to the adhesive layer 310 through the second base member 322 and the first base member 321, and accordingly, the adhesive layer 310 may be attached to the seating surface 204.

At this time, the pressure transferred to the adhesive layer 310 may be determined by a rigidity of the second base member 322. That is, because the second base member 322 is formed of a rigid material, pressure may be effectively transferred to the adhesive layer 310 without loss.

The first base member 321 disposed between the adhesive layer 310 and the second base member 322 may have a predetermined thickness T1. Accordingly, the first base member 321 may transfer pressure uniformly throughout the whole area of the adhesive layer 310.

The first and second recesses 301 and 302 may be formed to be recessed from the back surface 322b of the second base member 322 toward the front direction thereof at a depth D smaller than a thickness T2 of the second base member 322.

That is, the second base member 322 may cover all of the back surface of the first base member 321. Accordingly, pressure applied to the back surface 322b of the second base member 322 may be uniformly transferred throughout the whole area of the first base member 321.

The front surface and the back surface of the electronic apparatus 1 may have curved surfaces in contact with the side surfaces. That is, as corners at which the front surface and the back surface of the electronic apparatus 1 meet the side surface are processed to be filleted, the electronic apparatus 1 may be formed with a smooth surface between each of the front surface and the back surface and the side surface.

The second base member 322 may be formed such that a front surface 322a thereof has a flat surface shape, and the back surface 322b thereof has a curved surface shape that gradually becomes closer with the front surface 322a of the second base member 322 toward the one side surface 205 of the housing 200.

That is, the second base member 322 which is disposed adjacently with the one side surface 205 of the housing 200 may have a thickness that gradually becomes thinner toward the one side surface 205 at which the second hole 220 is formed in correspondence to the shape of the above-described electronic apparatus 1.

The sealing member 300 may be disposed such that the both side surfaces at which the first and second recesses 301 and 302 are formed are perpendicular with the one side surface 205 of the housing 200. Specifically, the first side surface 300a at which the first recess 301 of the sealing member 300 is formed and the second side surface 300b at which the second recess 302 of the sealing member 300 is formed may be disposed along an X-axis. In addition, the one side surface 205 of the housing 200 at which the second hole 220 is formed may be disposed along a Y-axis.

In addition, the first and second recesses 301 and 302 may be formed at positions at which the thickness is the same from among the sealing member 300. That is, the first and second recesses 301 and 302 may have a horizontally symmetrical shape based on the X-axis. Accordingly, the pick-up device may easily grip the first and second recesses 301 and 302 of the sealing member 300.

Referring to FIG. 8, an area corresponding to the first and second spaces 211 and 212 from among the front surface of the sealing member may be shown in dotted lines. The second space 212 may include a first area R1 which overlaps with the first space 211 and a second area R2 which does not overlap with the first space 211.

The housing 200 may have a thickness that becomes gradually thinner as it becomes closer to the one side surface 205 (FIG. 2) at which the first opening 01 is formed. The sealing member 300 may also have a thickness that becomes gradually thinner as it becomes closer to the one side surface 205 (FIG. 2) of the housing 200 in correspondence to the shape of the housing 200. That is, the sealing member 300 may have a thickness that becomes gradually thinner as it moves in a +X direction.

The first area R1 may be positioned closer with the one side surface 205 (FIG. 2) of the housing 200 than the second area R2. That is, the first area R1 may be positioned in the +X direction based on the second area R2.

Accordingly, the sealing member 300 may have a thickness thinner at a position that corresponds with the first area R1 than the position that corresponds with the second area R2.

The first and second recesses 301 and 302 may be disposed at positions that correspond with the second area R2. That is, the second area R2 may be disposed between the first recess 301 and the second recess 302. Specifically, the first recess 301 may be positioned in a +Y direction of the second area R2, and the second recess 302 may be positioned in a −Y direction of the second area R2.

Accordingly, because the first and second recesses 301 and 302 are formed at a portion having a sufficiently large thickness from among the sealing member 300, the pick-up device may easily grip the first and second recesses 301 and 302 of the sealing member 300.

The sealing member 300 may be such that a thickness of the portion at which the first and second recesses 301 and 302 are formed is greater than or equal to 0. 5 times of a thickness of a thickest portion, but the numerical value is not limited thereto.

Figure 9:
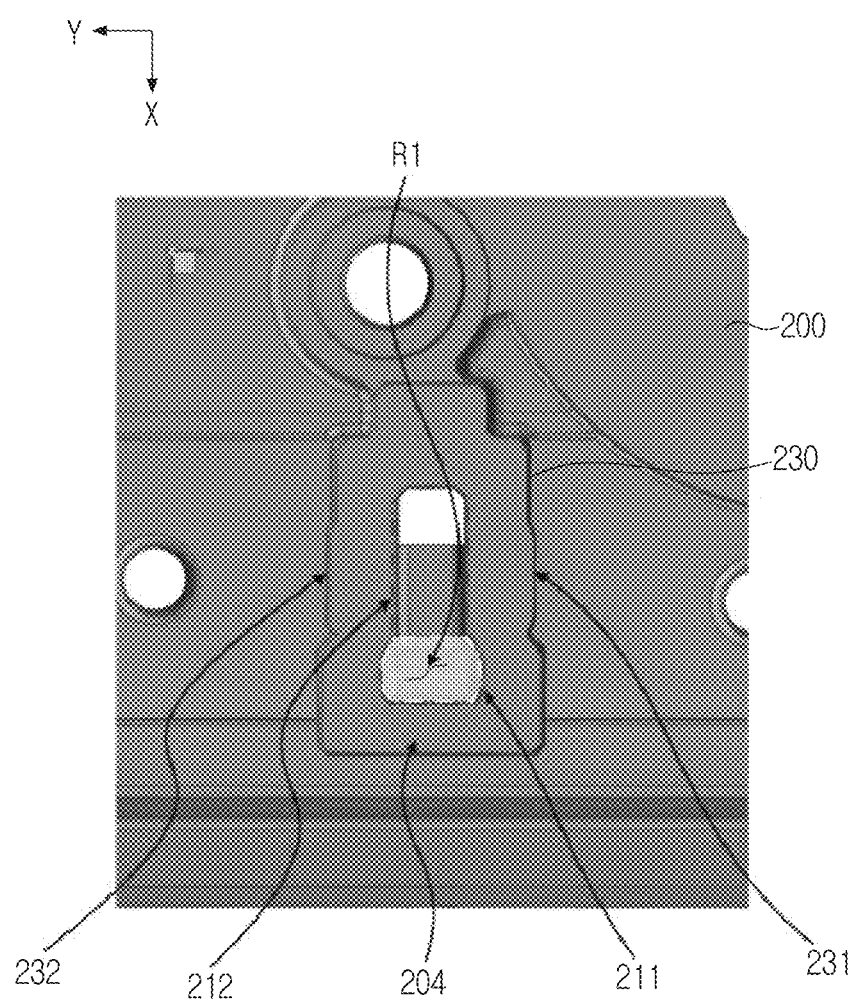
FIG. 9 is a back view of a housing according to an embodiment of the disclosure.
Figure 10:
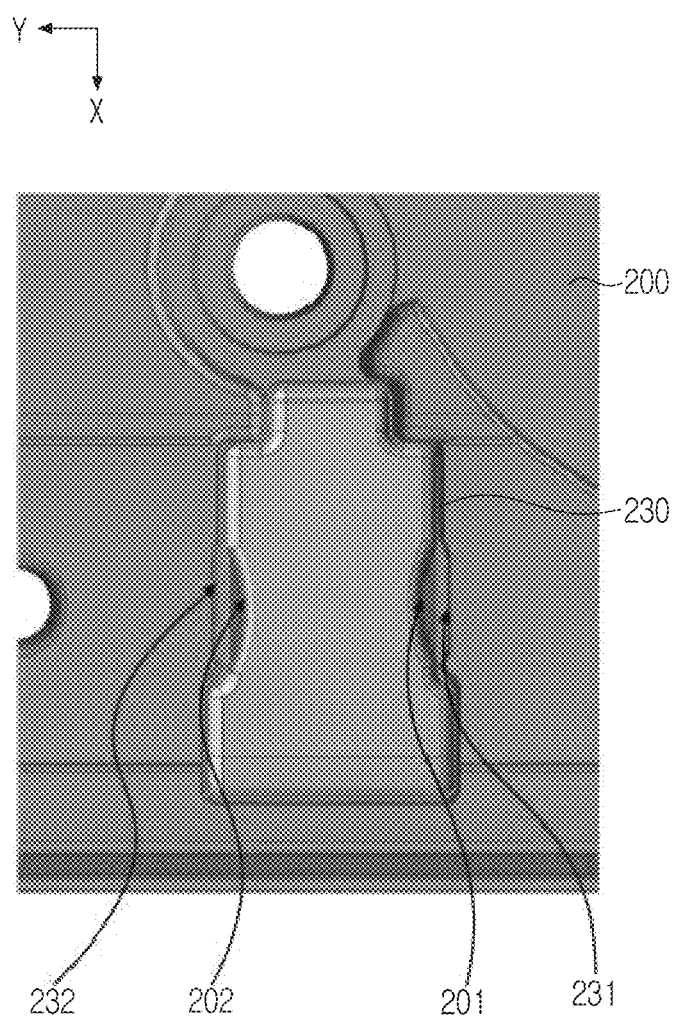
FIG. 10 is a view illustrating a state in which a sealing member is attached to the housing of FIG. 9 according to an embodiment of the disclosure.

FIG. 9 is a back view of a housing according to an embodiment of the disclosure. FIG. 10 is a view illustrating a state in which a sealing member is attached to the housing of FIG. 9 according to an embodiment of the disclosure.

Referring to FIGS. 9 and 10, the third and fourth recesses 231 and 232 formed at the side wall 230 of the housing 200 may guide an attachment position of the sealing member 300. Specifically, the user may position the first and second recesses 301 and 302 of the sealing member 300 so as to respectively face the third and fourth recesses 231 and 232.

At this time, because the pick-up device that grips the first and second recesses 301 and 302 may become sufficiently farther from the sealing member 300 toward the space between the sealing member 300 and the side wall 230, the pick-up device may accurately position the sealing member 300 at a designated position without interfering with the sealing member 300. Accordingly, a problem of the sealing member 300 being unintentionally lifted or the position changed by the pick-up device may be prevented.

FIGS. 11, 12, 13, and 14 are views illustrating various structures of a housing and a sealing member according to various embodiments of the disclosure.

Figure 11:
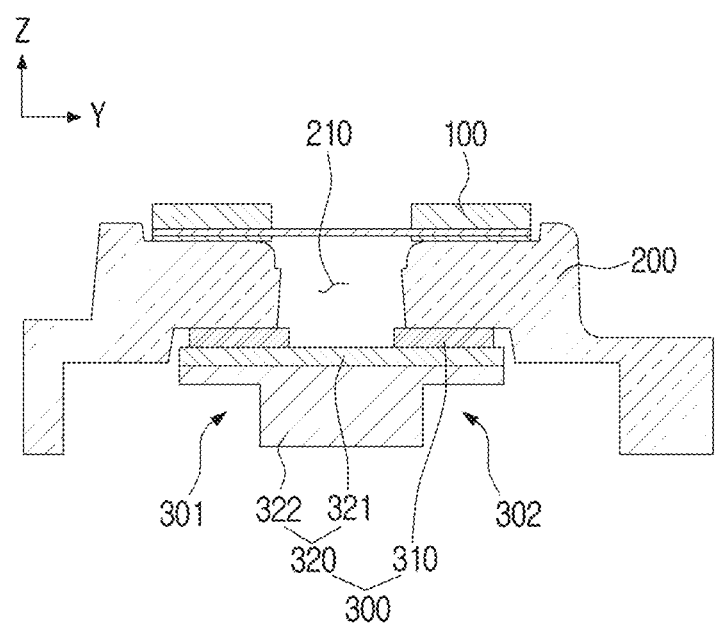
FIGS. 11, 12, 13, and 14 are views illustrating various structures of a housing and a sealing member according to various embodiments of the disclosure.
Figure 12:
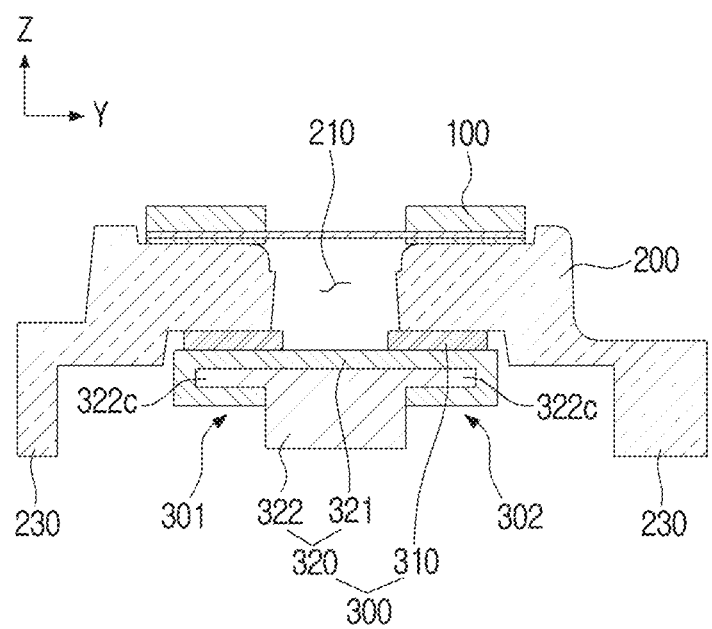

Referring to FIGS. 11 and 12, the sealing member 300 may include only the first and second recesses 301 and 302, and may not include the fifth recess 303. That is, the first base member 321 of the sealing member 300 may have a predetermined thickness and the front surface thereof may be formed as a flat surface.

In addition, referring to FIG. 12, the first base member 321 may surround a protrusion area 322c disposed in front of the first and second recesses 301 and 302 from among the second base member 322.

Specifically, the protrusion area 322c of the second base member 322 may be a portion positioned in front of the first and second recesses 301 and 302, and may be a portion that is adjacent with the side wall 230 of the housing 200 than another portion on a cross-section of a portion at which the first and second recesses 301 and 302 of the sealing member 300 are formed.

Accordingly, because a binding force between the first base member 321 and the second base member 322 is strengthened, a problem of the first and second base members 321 and 322 being unintentionally spaced apart from each other may be prevented.

Figure 13:
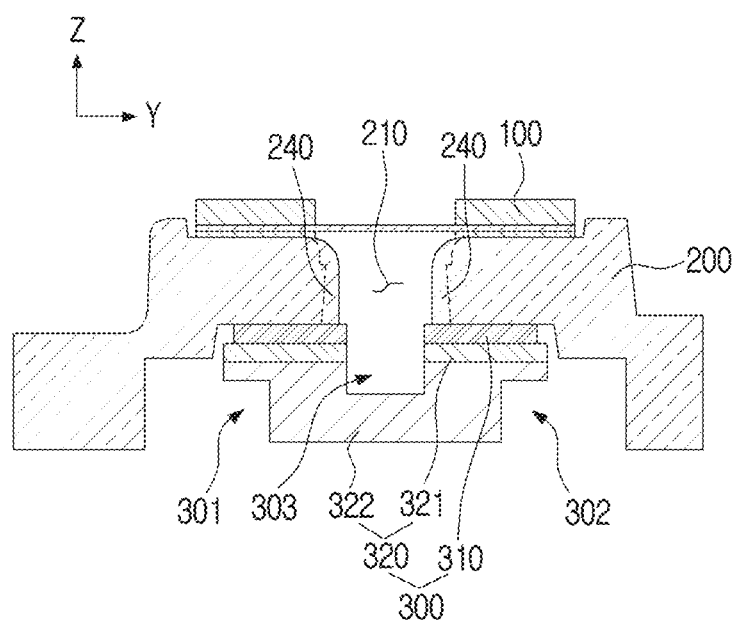
Figure 14:
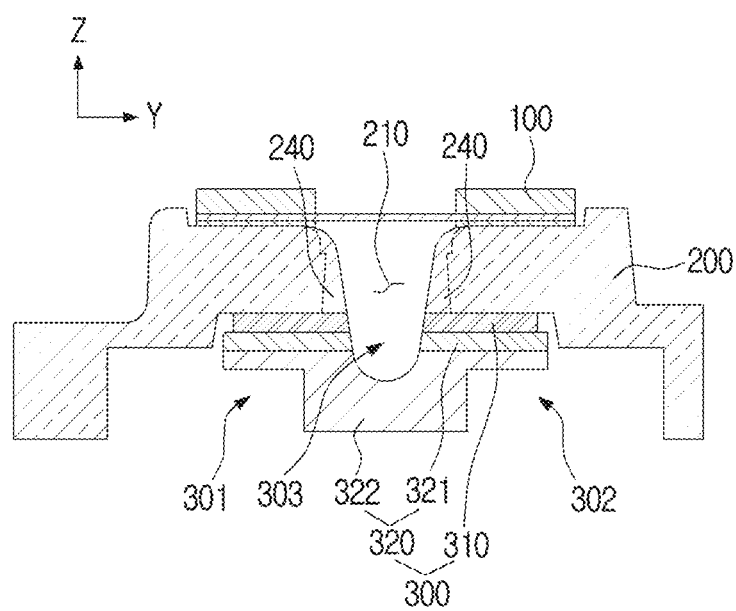

Referring to FIGS. 13 and 14, unlike the structure of the first and second base members 321 and 322 being recessed toward the back direction so as to correspond to the fifth recess 303 in FIG. 3, the fifth recess 303 may be extended and formed up to the second base member 322. That is, the first base member 321 may be omitted at a position at which the fifth recess 303 is formed. Accordingly, the volume of the sound pathway which is the inside space of the housing 200 that the sound travels may become greater.

Specifically, referring to FIG. 14, the second base member 322 may be convexly formed toward the back direction from a position that corresponds to the fifth recess 303. However, the shape of the second base member 322 is not limited thereto, and may have various cross-sectional shapes such as, for example, and without limitation, a circular arc, a quadrangle, and the like for an enhanced performance of the sound pathway.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic apparatus, comprising:
  a sound module;
  a housing configured to receive the sound module, and comprising:
    a first hole that is formed at a back surface thereof and communicating with the sound module, and
    a second hole that is formed at one side surface thereof and communicating with the first hole, and
  a sealing member that is attached to a back surface of the housing,
  wherein the sealing member comprises a recess that is formed on at least one from among side surfaces that face each other.

2. The electronic apparatus of claim 1,
  wherein the housing comprises a seating surface on which a portion of the back surface is formed stepped in a front direction,
  wherein the first hole is formed at the seating surface, and
  wherein the sealing member is attached to the seating surface and covers the first hole.

3. The electronic apparatus of claim 1, wherein the recess comprises:

a first recess formed at a first side surface of the sealing member, and a second recess formed at a second side surface that faces the first side surface of the sealing member.

4. The electronic apparatus of claim 1,
wherein the sealing member comprises:
   an adhesive layer attached to the back surface of the housing to surround the first hole, and
   a base member disposed at a back surface of the adhesive layer, and
wherein the recess is formed at the base member.

5. The electronic apparatus of claim 4,
wherein the base member comprises:
   a first base member that covers the back surface of the adhesive layer and is formed of an elastic material, and
   a second base member that covers a back surface of the first base member and is formed of a material rigid than the first base member, and
wherein the recess is formed at the second base member.

6. The electronic apparatus of claim 5, wherein the recess is formed to be recessed from a back surface of the second base member toward a front direction thereof at a depth smaller than a thickness of the second base member.

7. The electronic apparatus of claim 5, wherein the first base member surrounds a protrusion area disposed in front of the recess from among the second base member.

8. The electronic apparatus of claim 5, wherein the first base member has a predetermined thickness.

9. The electronic apparatus of claim 5,
wherein the second base member is formed such that a front surface thereof has a flat surface shape, and
wherein a back surface thereof has a curved surface shape that becomes gradually closer with a front surface of the second base member toward the one side surface of the housing.

10. The electronic apparatus of claim 1, wherein the sealing member is disposed such that a side surface at which the recess is formed is perpendicular with the one side surface of the housing.

11. The electronic apparatus of claim 1,
wherein the housing comprises a side wall surrounding the sealing member, and
wherein the side wall comprises at least one additional recess at a position that faces the recess.

12. The electronic apparatus of claim 11,
wherein the recess comprises:
   a first recess formed at a first side surface of the sealing member, and
   a second recess formed at a second side surface that faces the first side surface of the sealing member, and
wherein the additional recess comprises:
   a third recess disposed at a position that faces the first recess, and
   a fourth recess disposed at a position that faces the second recess.

13. The electronic apparatus of claim 11,
wherein the housing comprises a seating surface on which a portion of the back surface is formed stepped in a front direction, and
wherein the additional recess is extended and formed from the seating surface toward the back surface of the housing.

14. The electronic apparatus of claim 1, wherein the first hole comprises:
   a first space in which one end communicates with the second hole, and
   a second space in which one end is overlapped with an opposite end of the first space, and the opposite end communicates with the sound module.

15. The electronic apparatus of claim 14, wherein the second space comprises:
   a first area which overlaps with the first space and a second area which does not overlap with the second space, and
   the first and second recesses are disposed at positions that correspond with the second area.

* * * * *